(12) United States Patent
Furukawa

(10) Patent No.: US 8,184,263 B2
(45) Date of Patent: May 22, 2012

(54) MEASUREMENT APPARATUS AND EXPOSURE APPARATUS

(75) Inventor: Yasunori Furukawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 483 days.

(21) Appl. No.: 12/463,590

(22) Filed: May 11, 2009

(65) Prior Publication Data

US 2009/0279065 A1 Nov. 12, 2009

(30) Foreign Application Priority Data

May 12, 2008 (JP) ................................. 2008-124971

(51) Int. Cl.
*G03B 27/68* (2006.01)
*G01B 9/02* (2006.01)
*G03B 27/42* (2006.01)
*G03B 27/52* (2006.01)
*G03B 27/54* (2006.01)
*G01B 11/02* (2006.01)

(52) U.S. Cl. ................ 355/52; 355/53; 355/55; 355/67; 356/450; 356/511; 356/512; 356/515; 356/520; 356/521

(58) Field of Classification Search .................... 355/52, 355/53, 55, 67–71, 77; 356/450, 511, 512, 356/515, 520, 521, 451–456, 488, 489, 494, 356/495, 499; 702/189; 250/492.1, 492.2, 250/492.22, 548; 430/5, 8, 22, 30, 311, 312, 430/322
See application file for complete search history.

(56) References Cited

U.S. PATENT DOCUMENTS

| 5,835,227 A | 11/1998 | Grodnensky et al. |
| 5,946,079 A * | 8/1999 | Borodovsky ..................... 355/67 |
| 2001/0028462 A1 * | 10/2001 | Ichihara et al. ............... 356/512 |
| 2002/0041377 A1 * | 4/2002 | Hagiwara et al. ............. 356/399 |
| 2005/0117170 A1 * | 6/2005 | Hasegawa ..................... 356/521 |
| 2008/0070131 A1 * | 3/2008 | Yamazoe .......................... 430/5 |
| 2008/0246941 A1 * | 10/2008 | Otaki ............................... 355/67 |
| 2008/0259350 A1 * | 10/2008 | Furukawa ..................... 356/521 |
| 2008/0316448 A1 * | 12/2008 | Ohsaki ........................... 355/53 |

FOREIGN PATENT DOCUMENTS

| JP | 6-063868 B | 8/1994 |
| JP | 7-311094 A | 11/1995 |
| JP | 9-033357 A | 2/1997 |
| JP | 10-260108 A | 9/1998 |
| WO | WO 2006115292 A1 * | 11/2006 |

OTHER PUBLICATIONS

Statistical Optics; Joseph W. Goodman; pp. 170-183.
Statistical Optics; Joseph W. Goodman; pp. 170-183, published Jan. 18, 1985.

* cited by examiner

*Primary Examiner* — Peter B Kim
*Assistant Examiner* — Christina Riddle
(74) *Attorney, Agent, or Firm* — Canon USA, Inc., IP Division

(57) ABSTRACT

A measurement apparatus which measures spatial coherence in an illuminated plane illuminated by an illumination system, comprises a measurement mask which has at least three pinholes and is arranged on the illuminated plane, a detector configured to detect an interference pattern formed by lights from the at least three pinholes, and a calculator configured to calculate the spatial coherence in the illuminated plane based on a Fourier spectrum obtained by Fourier-transforming the interference pattern detected by the detector.

1 Claim, 11 Drawing Sheets

FIG. 1
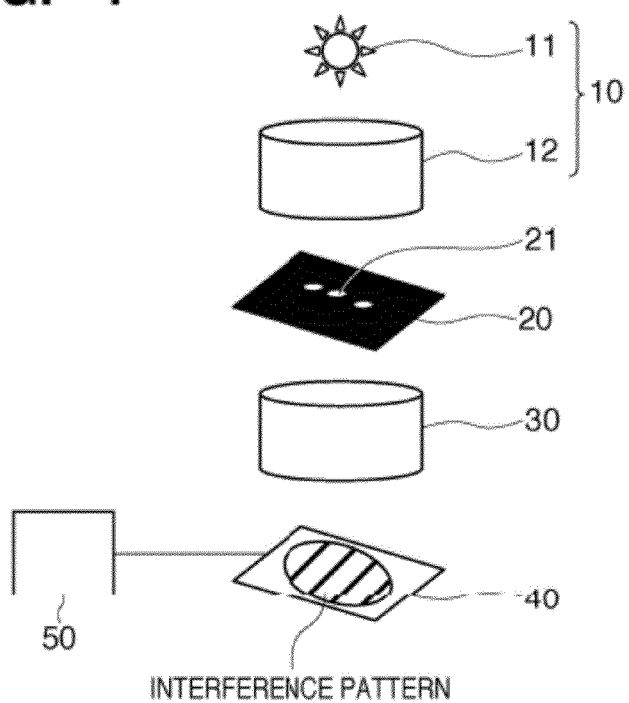
INTERFERENCE PATTERN
FIG. 2A        FIG. 2B        FIG. 2C
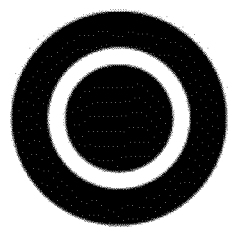  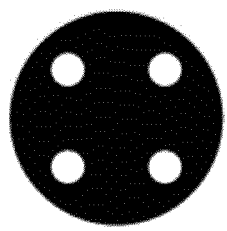  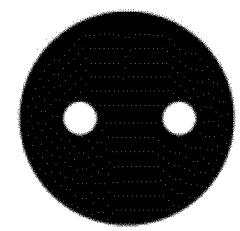

INTERFERENCE PATTERN

INTERFERENCE PATTERN

INTERFERENCE PATTERN

INTERFERENCE PATTERN

INTERFERENCE PATTERN

MEASUREMENT APPARATUS AND EXPOSURE APPARATUS

BACKGROUND OF THE INVENTION

1. Field of the Invention

The present invention relates to a measurement apparatus which measures spatial coherence, and an exposure apparatus including the same.

2. Description of the Related Art

In a lithography process for manufacturing devices such as a semiconductor device, mainly in photolithography, the NA of a projection optical system is increasing, and the wavelength of exposure light is shortening in an exposure apparatus. As the NA increases, the resolving power improves, but the depth of focus decreases. For this reason, from the viewpoint of forming finer patterns than ever before, increasing the NA of the projection optical system alone has proved to be insufficient to sustain stable mass production. Under the circumstances, so-called modified illumination methods which improve the resolution characteristics by optimizing an illumination optical system are attracting a great deal of attention.

There is a recent tendency to optimize not only the σ value, that is, the ratio between the NAs of the illumination optical system and projection optical system but also the effective light source shapes for individual original patterns. Examples of the modified illumination are annular illumination, quadrupole illumination, and dipole illumination.

However, the optical path changes upon changing the illumination mode, so spatial coherence on the original surface (in the object plane of the projection optical system) changes due to, for example, unevenness of an antireflection coating of an optical element which constitutes the illumination optical system or decentering of the optical element. Such a change in spatial coherence has a considerable influence on the quality of an image formed on the image plane of the projection optical system. It is therefore important to know spatial coherence and take it into consideration in designing an original and determining the effective light source distribution.

Known spatial coherence measurement methods are the following three methods. The first method is so-called Young interferometry or a double pinhole method (Joseph W. Goodman, "Statistical Optics"). The second method is shearing interferometry. The third method is a method of measuring spatial coherence based on a change in a certain pattern image.

FIG. 17 is a view showing the principle of Young interferometry as the first method. A plate 61 having two pinholes is irradiated by a light source 60, and the light beams from these two pinholes are made to interfere with each other on a screen 62 set behind the plate 61, thereby calculating spatial coherence based on the contrast of the obtained interference fringes. Japanese Patent Laid-Open No. 7-311094 describes an application example of the first method.

FIG. 18 is a view showing the principle of shearing interferometry as the second method. FIG. 18 schematically shows the structure of a Michelson interferometer. In the Michelson interferometer, when incident light 70 strikes a half mirror 71, it is split into a light beam 70a which travels toward a reference prism mirror 72 and a light beam 70b which travels toward a movable prism mirror 73. Light beams 70c and 70d reflected by the respective mirrors 72 and 73 return to the half mirror 71 and are superposed on each other to form interference fringes on a screen 74.

When the reference prism mirror 72 and the movable prism mirror 73 are placed such that two light beams which travel toward them have the same optical path length, and the movable prism mirror 73 moves in the Y-axis direction, the reflected light beam 70d also moves by the same distance and is superposed on the reflected light beam 70c. At this time, since the contrast of the interference fringes change in correspondence with spatial coherence, the spatial coherence can be measured by observing the moving distance of the movable prism mirror 73 in the Y-axis direction, and a change in the contrast of the interference fringes. Japanese Patent Laid-Open No. 9-33357 and Japanese Patent Publication No. 6-63868 describe application examples of the second method.

Japanese patent Laid-Open No. 10-260108 describe an example of the third method. According to Japanese Patent Laid-Open No. 10-260108, spatial coherence is measured by projecting a rhombic pattern and measuring the size of the projected image.

Unfortunately, Young interferometry as the first method has a demerit that the two pinholes need to be replaced a plurality of times to obtain spatial coherences at a plurality of points because the interval between these pinholes is fixed, taking a long period of time. Shearing interferometry as the second method has a demerit that not only a high-precision optical system is necessary but also it is hard to mount a shearing interferometer into an exposure apparatus which has significant spatial constraints because of its difficulty in downsizing. The third method is mainly used to measure the σ value (the ratio (NAill/NApl)) between a numerical aperture NAill of an illumination optical system and a numerical aperture NApl of a projection optical system when circular illumination is performed by the illumination optical system). The third method has a demerit that it is necessary to measure the image size and compare it with a reference table provided in advance. The third method has other demerits that when an effective light source distribution is formed into a complicated shape instead of a circular shape, a table compatible with this shape is necessary, and that measuring the image size is insufficient to measure a complicated spatial coherence distribution.

SUMMARY OF THE INVENTION

The present invention has been made in consideration of the above-described situation, and has as its object to provide a technique for measuring, for example, spatial coherence with a simple arrangement.

One of the aspect of the present invention provides a measurement apparatus which measures spatial coherence in an illuminated plane illuminated by an illumination system, the apparatus comprising a measurement mask which has at least three pinholes and is arranged on the illuminated plane, a detector configured to detect an interference pattern formed by lights from the at least three pinholes, and a calculator configured to calculate the spatial coherence in the illuminated plane based on a Fourier spectrum obtained by Fourier-transforming the interference pattern detected by the detector.

Further features of the present invention will become apparent from the following description of exemplary embodiments with reference to the attached drawings.

BRIEF DESCRIPTION OF THE DRAWINGS

FIG. 1 is a view showing the schematic arrangement of a measurement apparatus and exposure apparatus according to the first embodiment of the present invention;

FIGS. 2A to 2C are views illustrating effective light source distributions;

DESCRIPTION OF THE EMBODIMENTS

Figure 3A:
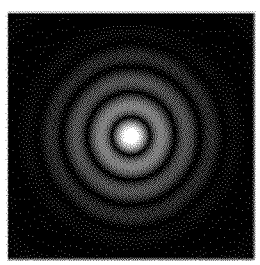
FIGS. 3A to 3C are views showing spatial coherences in the object plane of an optical system.

Preferred embodiments of the present invention will be described below with reference to the accompanying drawings. Note that the same reference numerals denote the same elements throughout the drawings, and a repetitive description thereof will not be given.

[First Embodiment]

FIG. 1 is a view showing the schematic arrangement of a measurement apparatus and exposure apparatus according to the first embodiment of the present invention. This measurement apparatus is included in an exposure apparatus which projects the pattern of an original (also called a mask or reticle) onto a substrate by a projection optical system 30 to expose the substrate. Note that the original is arranged on the object plane of the projection optical system 30, and the substrate is arranged on the image plane of the projection optical system 30. The object plane of the projection optical system 30 is also an illuminated plane illuminated by an illumination optical system 12.

The measurement apparatus according to the first embodiment is configured to measure spatial coherence in the object plane of the projection optical system 30. The exposure apparatus includes the projection optical system 30, an original positioning apparatus for arranging an original on the object plane of the projection optical system 30, a substrate positioning apparatus for arranging a substrate on the image plane of the projection optical system 30, and an illumination system 10 for illuminating the original arranged on the object plane (the illuminated plane). The measurement apparatus includes a measurement mask 20 arranged on the object plane of the projection optical system 30, and a detector 40 arranged on the image plane of the projection optical system 30. The measurement mask 20 is typically positioned by the original positioning apparatus. The detector 40 is typically positioned by the substrate positioning apparatus.

The illumination system 10 illuminates the original during substrate exposure, and illuminates the measurement mask 20 during spatial coherence measurement. The illumination system 10 includes, for example, a light source unit 11 and the illumination optical system 12. A light source unit for spatial coherence measurement can be the same as that for substrate exposure. Accordingly, a single light source unit 11 can be used for both substrate exposure and spatial coherence measurement. Although the light source unit 11 can be, for example, an ArF excimer laser having an oscillation wavelength of about 193 nm, a KrF excimer laser having an oscillation wavelength of about 248 nm, or an EUV light source having a wavelength of about 13.5 nm, it is not limited to these examples. The illumination optical system 12 is configured to Kohler-illuminate the original and the measurement mask 20. The illumination optical system 12 includes, for example, a fly-eye lens, aperture stop, condenser lens, and slit, and has a function of forming a targeted effective light source shape (to be described later).

The measurement mask 20 has a plurality of pinholes 21. Herein, the pinhole means a through hole in a narrow sense. However, throughout this specification and the scope of claims, the pinhole includes a small local region on the entire surface of a reflection type measurement mask configured to reflect only light which enters the local region.

The detector 40 detects (senses) an interference pattern formed on the image plane of the projection optical system 30 by light emerging from the plurality of pinholes 21 in the measurement mask 20. The detector 40 includes a photoelectric conversion device. Although the detector 40 preferably includes an image sensor such as a CCD image sensor as a photoelectric conversion device, it may include a unit-pixel photoelectric conversion device or a linear sensor such as a CCD linear sensor. If a unit-pixel photoelectric conversion device or a linear sensor such as a CCD linear sensor is used as a photoelectric conversion device, the detector 40 can sense an interference pattern by scanning it.

If the spatial coherence of light with which the illumination system 10 illuminates the original is relatively high, the exposure apparatus cannot transfer the original pattern onto the substrate because light beams having passed through the original pattern interfere with each other. To avoid this situation, the spatial coherence of light which illuminates the original is decreased using, for example, a fly-eye lens. The measurement apparatus is configured to measure spatial coherence in the plane on which the original is arranged in the exposure apparatus.

The illumination optical system 12 forms effective light source distributions having, for example, an annular shape (FIG. 2A), a quadrupole shape (FIG. 2B), and a dipole shape (FIG. 2C) using an aperture and a CGH (Computer Generated Hologram).

The relationship between illumination by the illumination system and spatial coherence in the object plane of the projection optical system, and particularly that between the effective light source distribution and spatial coherence in the object plane of the projection optical system, will be explained below.

Let $\lambda$ be the wavelength of light emitted by the light source unit 11, f be the focal length of the illumination optical system 12, $(\epsilon, \eta)$ be the coordinate position normalized by f$\lambda$, u($\epsilon, \eta$)

be the effective light source distribution, and (x, y) be the coordinate position of the measurement mask 20. Then, the distribution of spatial coherence (a so-called mutual intensity $\Gamma(x, y)$) at the origin (0, 0) is described by:

$$\Gamma(x, y) = \int u(\epsilon, \eta) \exp\{i2\pi(\epsilon x + \eta y)\} d\epsilon d\eta \quad (1)$$

Figure 3B:
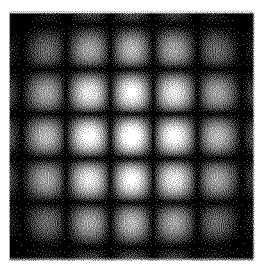
Figure 3C:
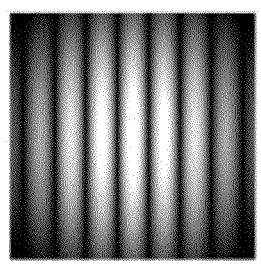

Note that equation (1) is called the Van Cittert-Zernike theorem, which indicates that spatial coherence is calculated by Fourier-transforming an effective light source distribution. When the measurement mask 20 is illuminated with an effective light source distribution having, for example, an annular shape (FIG. 2A), a quadrupole shape (FIG. 2B), or a dipole shape (FIG. 2C) while the amount of light is constant, spatial coherence on the measurement mask 20 is as shown in FIGS. 3A, 3B, or 3C, respectively. Also, since the measurement mask 20 is Kohler-illuminated as mentioned above, the spatial coherence described by equation (1) holds over the entire illumination region on the measurement mask 20 in theory.

The explanation will be continued assuming that the number of pinholes 21 which are formed on the measurement mask 20 and serve to measure spatial coherences is three hereinafter. Assume that the three pinholes 21 align themselves on one straight line at unequal intervals, and their positions are $P0(x_0, y_0)$, $P1(x_1, y_1)$, and $P2(x_2, y_2)$, respectively, and satisfy:

$$y_2 = \frac{(y_1 - y_0)(x_2 - x_0)}{x_1 - x_0} + y_0 \quad (2)$$

$$|x_1 - x_0| \neq |x_2 - x_0|$$

$$|x_1 - x_0| \neq |x_2 - x_1|$$

$$|x_2 - x_0| \neq |x_2 - x_1|$$

An interference pattern formed on the detection surface of the detector 40 as light which illuminates the measurement mask 20 in the illumination system 10 and is transmitted through the three pinholes 21 passes through the projection optical system 30 is described by:

$$I = A[3 + 2\Gamma_{01}\cos(kL_{01} \cdot X) + 2\Gamma_{32}\cos(kL_{02} \cdot X) + 2\Gamma_{12}\cos(kL_{12} \cdot X)] \quad (3)$$

where A is a proportionality constant, X is a vector representing the detection position coordinates of the detector 40, $\Gamma_{ij}$ is the spatial coherence value at $(x_j - x_i, y_j - y_i)$ in the plane on which the measurement mask 20 is arranged (the object plane), k is $2\pi/\lambda$, $L_{ij}$ is a vector which represents the difference between the optical path lengths from $Pi(x_i, y_i)$ and $Pj(x_j, y_j)$ to the detection position of the detector 40 and is proportional to $(x_j - x_i, y_j - y_i)$, i and j are integers from 0 to 2, and X is the wavelength of light emitted by the light source unit 11.

Fourier transformation is used to acquire the spatial coherence distribution in the plane, on which the measurement mask 20 is arranged, based on the interference pattern detected by the detector 40. A calculator 50 Fourier-transforms one interference pattern to calculate spatial coherences at a plurality of positions in the plane on which the measurement mask 20 is arranged. If the interference pattern is distorted due to the influence of the numerical aperture (NA) of the projection optical system 30 in Fourier transformation, it is desirably performed after data interpolation by coordinate transformation which takes account of the NA. The Fourier transform of the interference pattern described by equation (3) is given by:

$$FFT\{I\} = A\left[3\delta(0,0) + \Gamma_{01}\delta\left(\frac{1}{kL_{01}}\right) + \Gamma_{02}\delta\left(\frac{1}{kL_{02}}\right) + \Gamma_{12}\delta\left(\frac{1}{kL_{12}}\right) + \Gamma_{01}\delta\left(-\frac{1}{kL_{01}}\right) + \Gamma_{02}\delta\left(-\frac{1}{kL_{02}}\right) + \Gamma_{12}\delta\left(-\frac{1}{kL_{12}}\right)\right] \quad (4)$$

This Fourier transformation yields a Fourier spectrum.

Let $F_0$ be the Fourier spectrum value around zero frequency, and $F_{ij}$ be the Fourier spectrum value (although signals representing positive and negative Fourier spectrum values are generated in the Fourier space, the absolute value of one of them is assumed to be $F_{ij}$) around a frequency corresponding to the difference in optical path length $L_{ij}$ (the frequency of the interference pattern). Then, we can write:

$$F_0 = 3A$$

$$F_{ij} = \Gamma_{ij} A \quad (5)$$

From equation (5), we have:

$$\Gamma_{ij} = \frac{3 F_{ij}}{F_0} \quad (6)$$

In accordance with equation (6), the calculator 50 calculates the spatial coherence value $\Gamma_{ij}$ at the position $(x_j - x_i, y_j - y_i)$ in the plane on which the measurement mask 20 is arranged.

When a measurement mask 20 having three pinholes 21 is used, the spatial coherence values at three points (six points considering that the spatial coherence distribution is symmetric about the origin) are obtained by the above-mentioned calculation.

The interference pattern detected by the detector 40 is described by:

$$I \approx \Gamma \cos\left(\frac{2\pi Xp}{\lambda h} x\right) + Const. \quad (7)$$

where h is the distance between the focal position of the projection optical system 30 and the detection surface of the detector 40, X is the magnification of the projection optical system 30, and p is the distance between the pinholes 21 in the measurement mask 20.

In view of this, the detector 40 is set at a position at which the frequency of the interference pattern does not exceed the Nyquist frequency of the detector 40 and a sufficient light intensity is obtained. More specifically, the detector 40 is arranged at a position which satisfies:

$$h > \frac{2Xpg}{\lambda} \quad (8)$$

where g is the detection pitch of the detector 40.

The detector 40 may be a detector which measures the depth of an image formed on a resist by exposing it, instead of using a photoelectric conversion device which detects the interference pattern itself.

Also, the calculator 50 may adjust the illumination system 10 based on the spatial coherence measurement result. That is, the calculator 50 may feed back the spatial coherence measurement result to the illumination system 10.

Figure 4:
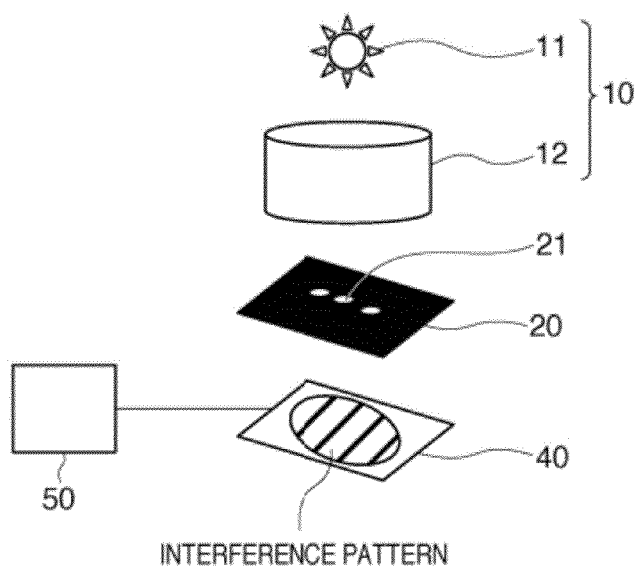
FIG. 4 is a view showing the schematic arrangement of a measurement apparatus according to a modification to the first embodiment of the present invention.

An optical system such as the projection optical system 30 is not indispensable, and an arrangement as illustrated in FIG. 4 may be adopted. In this case, the detector 40 is arranged at a position which satisfies equation (8). Note that X=1 and h is the distance between the measurement mask 20 and the detector 40. The measurement mask 20 and the detector 40 may be integrated with each other. Alternatively, the measurement mask 20 may have a configuration which is insertable and exchangeable with respect to the detector 40.

As described above, according to the first embodiment, the measurement apparatus has a simple arrangement and yet can easily and accurately measure spatial coherence in the plane, on which the original is arranged, in a short period of time.

[Second Embodiment]

Figure 5:
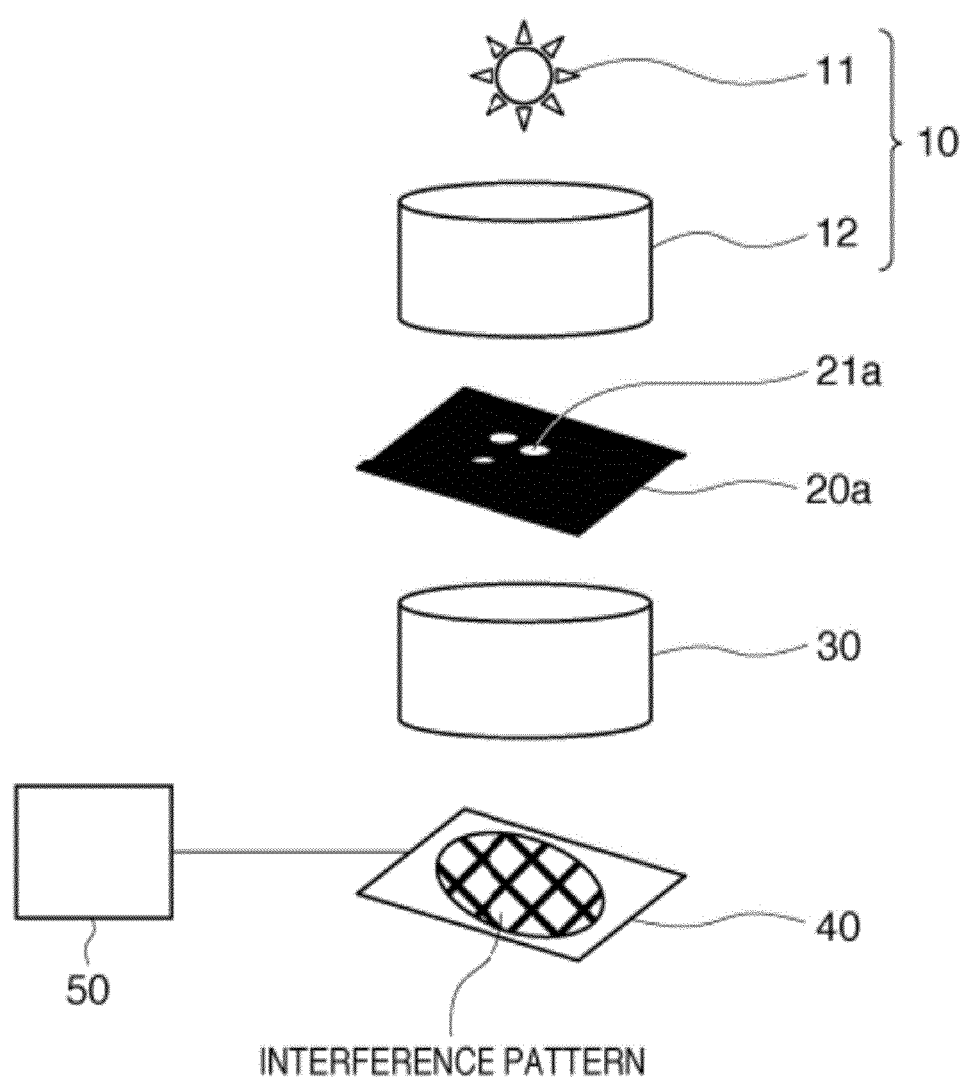
FIG. 5 is a view showing the schematic arrangement of a measurement apparatus and exposure apparatus according to the second embodiment of the present invention.

FIG. 5 is a view showing the schematic arrangement of a measurement apparatus and exposure apparatus according to the second embodiment of the present invention. This measurement apparatus uses a measurement mask 20a. Note that details which are not particularly referred to herein can be the same as in the first embodiment. The measurement mask 20a has three pinholes 21a which are not on one straight line. The positions of the three pinholes 21a are assumed to be Pa0 ($x_{a0}$, $y_{a0}$), Pa1 ($x_{a1}$, $y_{a1}$), and Pa2 ($x_{a2}$, $y_{a2}$) herein.

An interference pattern formed on the detection surface of a detector 40 as light which illuminates the measurement mask 20a in an illumination system 10 and is transmitted through the three pinholes 21a passes through a projection optical system 30 is described by:

$$I_a = A_a[3 + 2\Gamma_{a01} \cos(kL_{a01} \cdot X) + 2\Gamma_{a02} \cos(kL_{a02} \cdot X) + 2\Gamma_{a12} \cos(kL_{a12} \cdot X)] \quad (9)$$

where $\Gamma_{aij}$ is the spatial coherence value at ($x_{aj}-x_{ai}$, $y_{aj}-y_{ai}$) in the plane on which the measurement mask 20a is arranged, $L_{aij}$ is a vector which represents the difference between the optical path lengths from Pai ($x_{ai}$, $y_{ai}$) and Paj ($x_{aj}$, $y_{aj}$) to the detection position of the detector 40 and is proportional to ($x_{aj}-x_{ai}$, $y_{aj}-y_{ai}$), and i and j are integers from 0 to 2.

A calculator 50 analyzes the interference pattern detected by the detector 40 to calculate spatial coherence, as in the first embodiment. The analysis method will be explained below. The calculator 50 Fourier-transforms the interference pattern detected by the detector 40. The Fourier transform of the interference pattern is given by:

$$FFT\{I_a\} = A_a\left[3\delta(0,0) + \Gamma_{a01}\delta\left(\frac{1}{kL_{a01}}\right) + \Gamma_{a02}\delta\left(\frac{1}{kL_{a02}}\right) + \Gamma_{a12}\delta\left(\frac{1}{kL_{a12}}\right) + \right.$$
$$\left. \Gamma_{a01}\delta\left(-\frac{1}{kL_{a01}}\right) + \Gamma_{a02}\delta\left(-\frac{1}{kL_{a02}}\right) + \Gamma_{a12}\delta\left(-\frac{1}{kL_{a12}}\right)\right] \quad (10)$$

This Fourier transformation yields a Fourier spectrum.

Let $F_{a0}$ be the Fourier spectrum value around zero frequency, and $F_{aij}$ be the Fourier spectrum value (although signals representing positive and negative Fourier spectrum values are generated in the Fourier space, the absolute value of one of them is assumed to be $F_{aij}$) around a frequency corresponding to the difference in optical path length $L_{aij}$ (the frequency of the interference pattern). Then, we can write:

$$F_{a0} = 3A_a$$

$$F_{aij} = \Gamma_{aij} A_a \quad (11)$$

From equation (11), we have:

$$\Gamma_{aij} = \frac{3F_{aij}}{F_{a0}} \quad (12)$$

In accordance with equation (12), the calculator 50 calculates the spatial coherence value $\Gamma_{aij}$ at the position ($x_{aj}-x_{a1}$, $y_{aj}-y_{a1}$) in the plane on which the measurement mask 20a is arranged.

When a measurement mask 20a having three pinholes 21a is used, the spatial coherence values at three points (six points considering that the spatial coherence distribution is symmetric about the origin) are obtained by the above-mentioned calculation.

[Third Embodiment]

Figure 6:
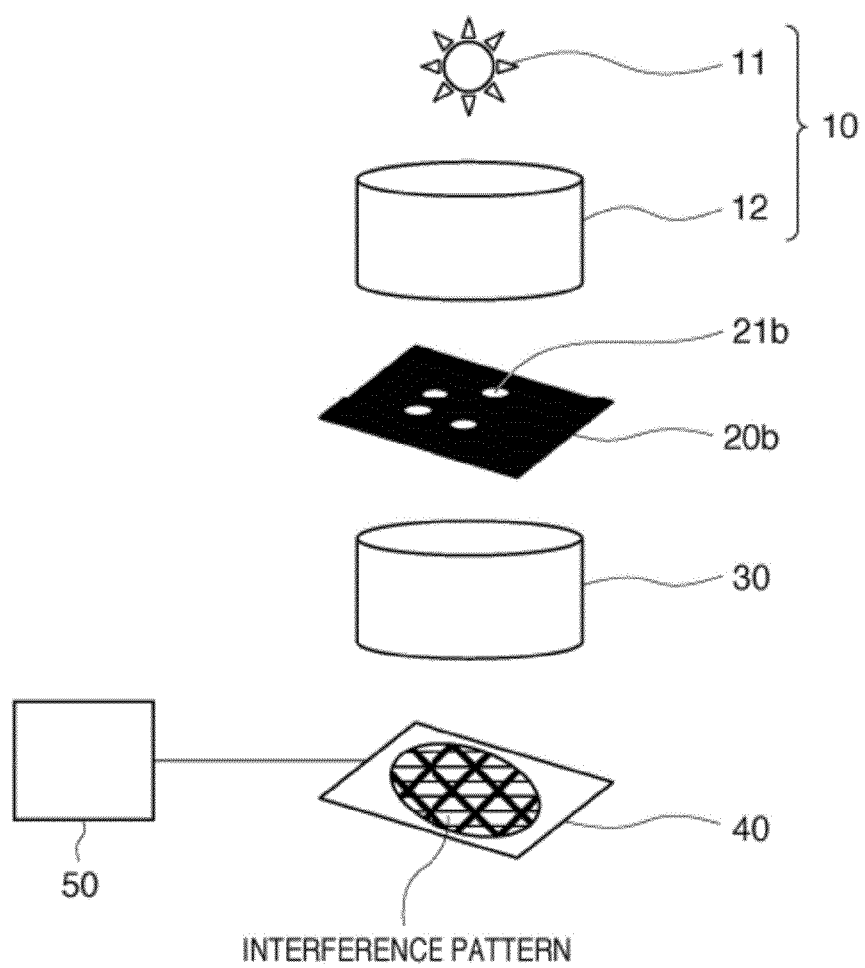
FIG. 6 is a view showing the schematic arrangement of a measurement apparatus and exposure apparatus according to the third embodiment of the present invention.

FIG. 6 is a view showing the schematic arrangement of a measurement apparatus and exposure apparatus according to the third embodiment of the present invention. This measurement apparatus uses a measurement mask 20b. Note that details which are not particularly referred to herein can be the same as in the first or second embodiment.

The measurement mask 20b has four pinholes 21b having different relative positions. The positions of the four pinholes 21b are assumed to be Pb0 ($x_{b0}$, $y_{b0}$), Pb1 ($x_{b1}$, $y_{b1}$), Pb2 ($x_{b2}$, $y_{b2}$), Pb3 ($x_{b3}$, $y_{b3}$) herein. When two pinholes are present at positions ($X_1$, $Y_1$) and ($X_2$, $Y_2$), their relative position is ($X_2-X_1$, $Y_2-Y_1$).

An interference pattern formed on the detection surface of a detector 40 as light which illuminates the measurement mask 20b in an illumination system 10 and is transmitted through the four pinholes 21b passes through a projection optical system 30 is described by:

$$I_b = A_b[4 + 2\Gamma_{b01}\cos(kL_{b01}\cdot X) + 2\Gamma_{b02}\cos(kL_{b02}\cdot X) + 2\Gamma_{b03}\cos(kL_{b03}\cdot X) + 2\Gamma_{b12}\cos(kL_{b12}\cdot X) + 2\Gamma_{b13}\cos(kL_{b13}\cdot X) + 2\Gamma_{b23}\cos(kL_{b23}\cdot X)] \quad (13)$$

where $\Gamma_{bij}$ is the spatial coherence value at ($x_{bj}-x_{bi}$, $y_{bj}-y_{bi}$) in the plane on which the measurement mask 20b is arranged, $L_{bij}$ is a vector which represents the difference between the optical path lengths from Pbi ($x_{bi}$, $y_{bi}$) and Pbj ($x_{bj}$, $y_{bj}$) to the detection position of the detector 40 and is proportional to ($x_{bj}-x_{bi}$, $y_{bj}-y_{bi}$), and i and j are integers from 0 to 3.

A calculator 50 analyzes the interference pattern detected by the detector 40 to calculate spatial coherence. The analysis method will be explained below. The calculator 50 Fourier-transforms the interference pattern detected by the detector 40. The Fourier transform of the interference pattern is given by:

$$FFT\{I_b\} = A_b\left[4\delta(0,0) + \Gamma_{b01}\delta\left(\frac{1}{kL_{b01}}\right) + \Gamma_{b02}\delta\left(\frac{1}{kL_{b02}}\right) + \right.$$
$$\Gamma_{b03}\delta\left(\frac{1}{kL_{b03}}\right) + \Gamma_{b12}\delta\left(\frac{1}{kL_{b12}}\right) + \Gamma_{b13}\delta\left(\frac{1}{kL_{b13}}\right) + \Gamma_{b23}\delta\left(\frac{1}{kL_{b23}}\right) +$$
$$\Gamma_{b01}\delta\left(-\frac{1}{kL_{b01}}\right) + \Gamma_{b02}\delta\left(-\frac{1}{kL_{b02}}\right) + \Gamma_{b03}\delta\left(-\frac{1}{kL_{b03}}\right) +$$
$$\left.\Gamma_{b12}\delta\left(-\frac{1}{kL_{b12}}\right) + \Gamma_{b13}\delta\left(-\frac{1}{kL_{b13}}\right) + \Gamma_{b23}\delta\left(-\frac{1}{kL_{b23}}\right)\right] \quad (14)$$

This Fourier transformation yields a Fourier spectrum.

Let $F_{b0}$ be the Fourier spectrum value around zero frequency, and $F_{bij}$ be the Fourier spectrum value (although signals representing positive and negative Fourier spectrum values are generated in the Fourier space, the absolute value of one of them is assumed to be $F_{bij}$) around a frequency corresponding to the difference in optical path length $L_{bij}$ (the frequency of the interference pattern). Then, we can write:

$$F_{b0}=4A_b$$

$$F_{bij}=\Gamma_{bij}A_b \quad (15)$$

From equation (15), we have:

$$\Gamma_{bij} = \frac{4F_{bij}}{F_{b0}} \quad (16)$$

In accordance with equation (16), the calculator 50 calculates the spatial coherence value $\Gamma_{bij}$ at the position $(x_{bj}-x_{bi}, y_{bj}-y_{bi})$ in the plane on which the measurement mask 20b is arranged.

When a measurement mask 20b having four pinholes 21b is used, the spatial coherence values at six points (12 points considering that the spatial coherence distribution is symmetric about the origin) are obtained by the above-mentioned calculation. This number applies to a case in which two out of four is selected.

As can easily be seen from the above-mentioned examples, the larger the number of pinholes, the larger the number of spatial coherence measurement points. More specifically, letting N be the number of pinholes, the number of measurement points is N(N−1)/2. Note that pinholes need to be arranged at positions at which the Fourier spectra of interference patterns each formed by light transmitted through two pinholes do not overlap each other. However, the same does not apply to a case in which pinholes are arranged at relatively the same position in order to increase the light intensity of the interference pattern, as will be described later.

[Fourth Embodiment]

Figure 7:
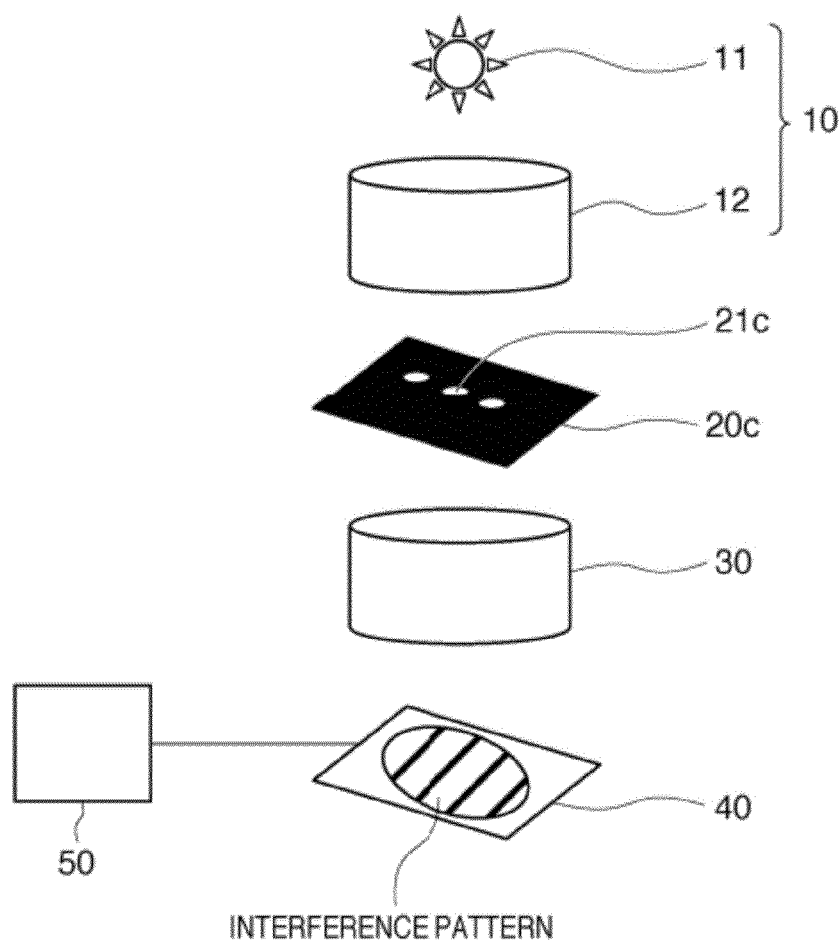
FIG. 7 is a view showing the schematic arrangement of a measurement apparatus and exposure apparatus according to the fourth embodiment of the present invention.

FIG. 7 is a view showing the schematic arrangement of a measurement apparatus and exposure apparatus according to the fourth embodiment of the present invention. This measurement apparatus uses a measurement mask 20c. Note that details which are not particularly referred to herein can be the same as in the first, second, or third embodiment.

In the fourth embodiment, three pinholes 21c in the measurement mask 20c have the same relative position in order to increase the light intensity of an interference pattern formed on the detection surface of a detector 40. The three pinholes 21c are arranged at positions Pc0 $(x_{c0}, y_{c0})$, Pc1 $(x_{c1}, y_{c1})$, and Pc2 $(x_{c2}, y_{c2})$ which align themselves on one straight line. Note that $x_{c2}=2x_{c1}-x_{c0}$ and $y_{c2}=2y_{c1}-y_{c0}$. Note also that the relative position between Pc0 and Pc1 is the same as that between Pc1 and Pc2.

An interference pattern formed on the detection surface of a detector 40 as light which illuminates the measurement mask 20c in an illumination system 10 and is transmitted through the three pinholes 21c passes through a projection optical system 30 is described by:

$$I_c = A_c[3 + 2\Gamma_{c01}\cos(kL_{c01}\cdot X) + 2\Gamma_{c02}\cos(kL_{c02}\cdot X) + 2\Gamma_{c12}\cos(kL_{c12}\cdot X)] \quad (17)$$

Since the relative position between Pc0 and Pc1 is the same as that between Pc1 and Pc2, Lc01=Lc12. Also, since the three pinholes 21c are adjacent to each other, $\Gamma_{c01}=\Gamma_{c12}$. Under these conditions, equation (17) can be rewritten as:

$$I_c = A_c[3 + 4\Gamma_{c01}\cos(kL_{c01}\cdot X) + 2\Gamma_{c02}\cos(kL_{c02}\cdot X)] \quad (18)$$

As can be seen from equation (18), the frequency coefficient in the term of $\Gamma_{c01}$ in this embodiment is twice that in the first embodiment. The Fourier transform of the interference pattern described by equation (18) is given by:

$$FFT\{I_c\} = A_c\left[3\delta(0,0) + 2\Gamma_{c01}\delta\left(\frac{1}{kL_{c01}}\right) + \right. \quad (19)$$

$$\left. \Gamma_{c02}\delta\left(\frac{1}{kL_{c02}}\right) + 2\Gamma_{c01}\delta\left(-\frac{1}{kL_{c01}}\right) + \Gamma_{c02}\delta\left(-\frac{1}{kL_{c02}}\right)\right]$$

This Fourier transformation yields a Fourier spectrum.

Let $F_{c0}$ be the Fourier spectrum value around zero frequency, and $F_{c01}$ be the Fourier spectrum value (although signals representing positive and negative Fourier spectrum values are generated in the Fourier space, the absolute value of one of them is assumed to be $F_{c01}$) around a frequency corresponding to the difference in optical path length $L_{c01}$ (the frequency of the interference pattern). Then, we can write:

$$F_{c0}=4A_c$$

$$F_{c01}=\Gamma_{c01}A_c \quad (20)$$

From equation (20), we have:

$$\Gamma_{c01} = \frac{2F_{c01}}{F_{c0}} \quad (21)$$

In accordance with equation (21), a calculator 50 calculates the spatial coherence value $\Gamma_{c01}$ at the position $(x_{c1}-x_{c0}, y_{c1}-y_{c0})$ in the plane on which the measurement mask 20c is arranged.

The calculator 50 calculates $\Gamma_{c02}$ in accordance equation (6), as in the first embodiment.

In the fourth embodiment, the spatial coherence values at two points (four points considering that the spatial coherence distribution is symmetric about the origin) can be measured using three pinholes, and the measured intensity of $\Gamma_{c01}$ is twice that in the first embodiment, facilitating the measurement.

[Fifth Embodiment]

Figure 8:
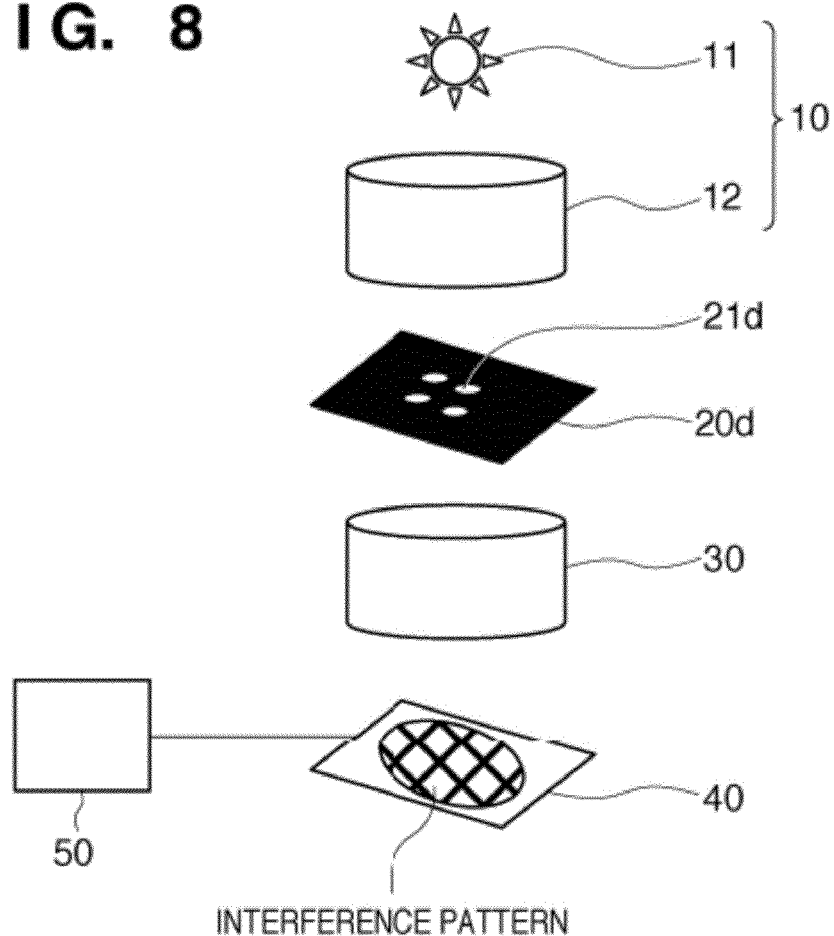
FIG. 8 is a view showing the schematic arrangement of a measurement apparatus and exposure apparatus according to the fifth embodiment of the present invention.

FIG. 8 is a view showing the schematic arrangement of a measurement apparatus and exposure apparatus according to the fifth embodiment of the present invention. This measurement apparatus uses a measurement mask 20d. Note that details which are not particularly referred to herein can be the same as in the first to fourth embodiments.

In the fifth embodiment, four pinholes 21d in the measurement mask 20d have the same relative positions in order to increase the light intensity of an interference pattern formed on the detection surface of a detector 40. The four pinholes 21d are arranged at positions Pd0 $(x_{d0}, y_{d0})$, Pd1 $(x_{d1}, y_{d1})$, Pd2 $(x_{d2}, y_{d2})$, and Pd3 $(x_{d3}, y_{d3})$ which correspond to the vertices of a parallelogram. Note that $x_{d3}=x_{d2}+x_{d1}-x_{d0}$ and $y_{d3}=y_{d2}+y_{d1}-y_{d0}$. Note also that the relative position between Pd0 and Pd1 is the same as that between Pd2 and Pd3, and the relative position between Pd0 and Pd2 is the same as that between Pd1 and Pd3.

An interference pattern formed on the detection surface of the detector 40 as light which illuminates the measurement mask 20d in an illumination system 10 and is transmitted through the four pinholes 21d passes through a projection optical system 30 is described by:

$$I_d = A[4 + 2\Gamma_{d01}\cos(kL_{d01}\cdot X) + 2\Gamma_{d02}\cos(kL_{d02}\cdot X) + 2\Gamma_{d03}\cos(kL_{d03}\cdot X) + 2\Gamma_{d12}\cos(kL_{d12}\cdot X) + 2\Gamma_{d13}\cos(kL_{d13}\cdot X) + 2\Gamma_{d23}\cos(kL_{d23}\cdot X)] \quad (22)$$

where $\Gamma_{dij}$ is the spatial coherence value at $(x_{dj}-x_{di}, y_{dj}-y_{di})$ in the plane on which the measurement mask 20d is arranged, $L_{dij}$ is a vector which represents the difference between the optical path lengths from Pdi ($x_{di}$, $y_{di}$) and Pdj ($x_{dj}$, $y_{dj}$) to the detection position of the detector 40 and is proportional to ($x_{dj}-x_{di}$, $y_{dj}-y_{di}$), and i and j are integers from 0 to 3.

Since the relative position between Pd0 and Pd1 is the same as that between Pd2 and Pd3, and the relative position between Pd0 and Pd2 is the same as that between Pd1 and Pd3, $\Gamma_{d01}=\Gamma_{d23}$, $L_{d01}=L_{d23}$, $\Gamma_{d02}=\Gamma_{d13}$, and $L_{d02}=L_{d13}$. Under these conditions, equation (22) can be rewritten as:

$$I_d = A[4 + 2\Gamma_{d01}\cos(kL_{d01}\cdot X) + 4\Gamma_{d02}\cos(kL_{d02}\cdot X) + 2\Gamma_{d03}\cos(kL_{d03}\cdot X) + 2\Gamma_{d12}\cos(kL_{d12}\cdot X)] \quad (23)$$

As can be seen from equation (23), the frequency coefficients in the terms of $\Gamma_{d01}$ and $\Gamma_{d02}$ in this embodiment are twice those in the third embodiment.

The Fourier transform of the interference pattern described by equation (23) is given by:

$$FFT\{I_d\} = \quad (24)$$

$$A\left[4\delta(0,0) + 2\Gamma_{d01}\delta\left(\frac{1}{kL_{d01}}\right) + 2\Gamma_{d02}\delta\left(\frac{1}{kL_{d02}}\right) + \Gamma_{d03}\delta\left(\frac{1}{kL_{d03}}\right) + \Gamma_{d12}\delta\left(\frac{1}{kL_{d12}}\right) + 2\Gamma_{d01}\delta\left(-\frac{1}{kL_{d01}}\right) + \Gamma_{d02}\delta\left(-\frac{1}{kL_{d02}}\right) + \Gamma_{d03}\delta\left(-\frac{1}{kL_{d03}}\right) + \Gamma_{d12}\delta\left(-\frac{1}{kL_{d12}}\right)\right]$$

This Fourier transformation yields a Fourier spectrum.

Let $F_{d0}$ be the Fourier spectrum value around zero frequency, and $F_{d01}$ and $F_{d02}$ be the Fourier spectrum values (although signals representing positive and negative Fourier spectrum values are generated in the Fourier space, the absolute values of one of them are assumed to be $F_{d01}$ and $F_{d02}$) around frequencies corresponding to the differences in optical path length $L_{d01}$ and $L_{d02}$ (the frequencies of the interference patterns). Then, we can write:

$$F_{d0} = 4A$$

$$F_{d01} = 2\Gamma_{d01}A$$

$$F_{d02} = 2\Gamma_{d02}A \quad (25)$$

From equation (25), we have:

$$\Gamma_{d01} = \frac{2F_{d01}}{F_{d0}} \quad (26)$$

$$\Gamma_{d02} = \frac{2F_{d02}}{F_{d0}}$$

In accordance with equation (26), a calculator 50 calculates the spatial coherence values $\Gamma_{d01}$ and $\Gamma_{d02}$ at the positions ($x_{d1}-x_{d0}$, $y_{d1}-y_{d0}$) and ($x_{d2}-x_{d0}$, $y_{d2}-y_{d0}$) in the plane on which the measurement mask 20d is arranged.

The calculator 50 calculates $\Gamma_{d12}$ and $\Gamma_{d03}$ in accordance with equation (16), as in the third embodiment.

In the fifth embodiment, the spatial coherence values at four points (eight points considering that the spatial coherence distribution is symmetric about the origin) can be measured using four pinholes, and the measured intensities of $\Gamma_{d01}$ and $\Gamma_{d02}$ are twice those in the third embodiment.

Figure 9A:
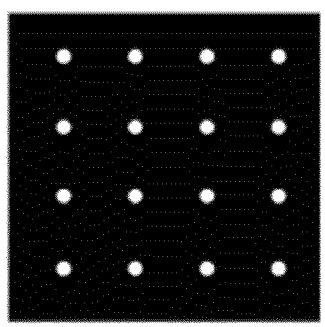
FIGS. 9A and 9B are views illustrating pinhole patterns.
Figure 9B:
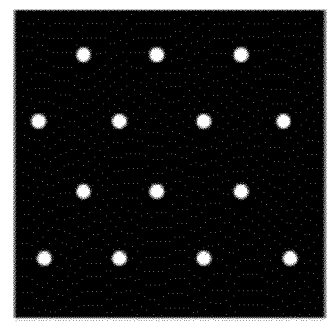

It is also possible to further increase the light intensity of the interference pattern, which is detected by the detector 40, using four or more pinholes having the same relative positions. For example, pinholes can be two-dimensionally and periodically arranged as shown in FIGS. 9A and 9B. With this arrangement, the interference pattern becomes robust against disturbances such as noise as its light intensity increases, thus improving the measurement accuracy and facilitating the measurement. FIG. 9A shows an example in which pinholes are arranged at the intersections of first lines arrayed with equal spaces between them along a first direction, and second lines arrayed with equal spaces between them along a direction perpendicular to the first direction. FIG. 9B shows an example in which pinholes are arranged at the intersections of first lines arrayed with equal spaces between them along a first direction, second lines arrayed with equal spaces between them along a second direction (the second direction forms an angle of 60° with the first direction), and third lines arrayed with equal spaces between them along a third direction (the third direction forms an angle of 60° with both the first and second directions).

The calculator 50 can calculate spatial coherence $\Gamma_p$ in accordance with:

$$\Gamma_p = \frac{2NF_p}{N_p F_0} \quad (27)$$

where N is the total number of pinholes, $N_p$ is the total number of pinholes which contribute to form an interference pattern with a frequency v (one pair of pinholes is counted as two pinholes), $F_0$ is the Fourier spectrum value of the interference pattern around zero frequency, and $F_p$ is the Fourier spectrum value around the frequency v.

The intensity of an interference pattern with the frequency v is proportional to $N_p$.

Figure 10A:
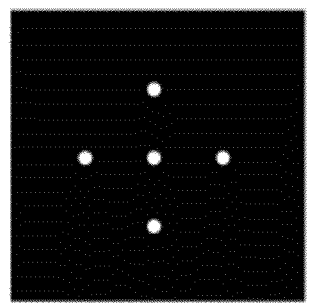
FIGS. 10A and 10B are views illustrating other pinhole patterns.
Figure 10B:
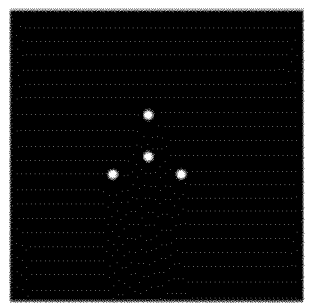
Figure 11A:
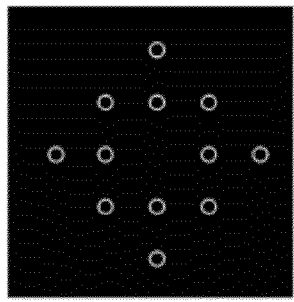
FIGS. 11A to 11C are views illustrating the spatial coherence measurement positions.
Figure 11B:
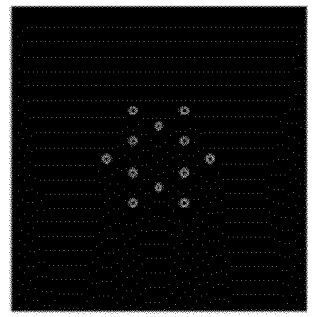
Figure 11C:
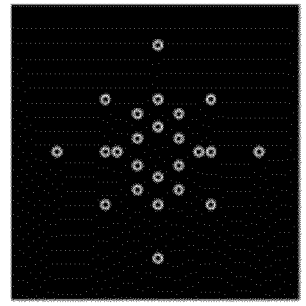

The use of a plurality of masks having pinholes with different relative positions allows an increase in the number of spatial coherence measurement points. For example, when pinhole patterns as shown in FIGS. 10A and 10B are used for the measurement, the measurement positions are as shown in FIGS. 11A and 11B. Hence, the positions of the obtained spatial coherences are as shown in FIG. 11C, revealing that the number of measurement points increases and the density of measurement positions increases in turn.

The arrangement of pinholes may be determined by determining the measurement points in accordance with the effective light source distribution in the illumination optical system.

The number of measurement points can also be increased by measuring the interference pattern while changing the relative position between pinholes by rotating or moving the measurement mask. This measurement apparatus can include a driving mechanism which rotates or moves the measurement mask.

[Sixth Embodiment]

Figure 12:
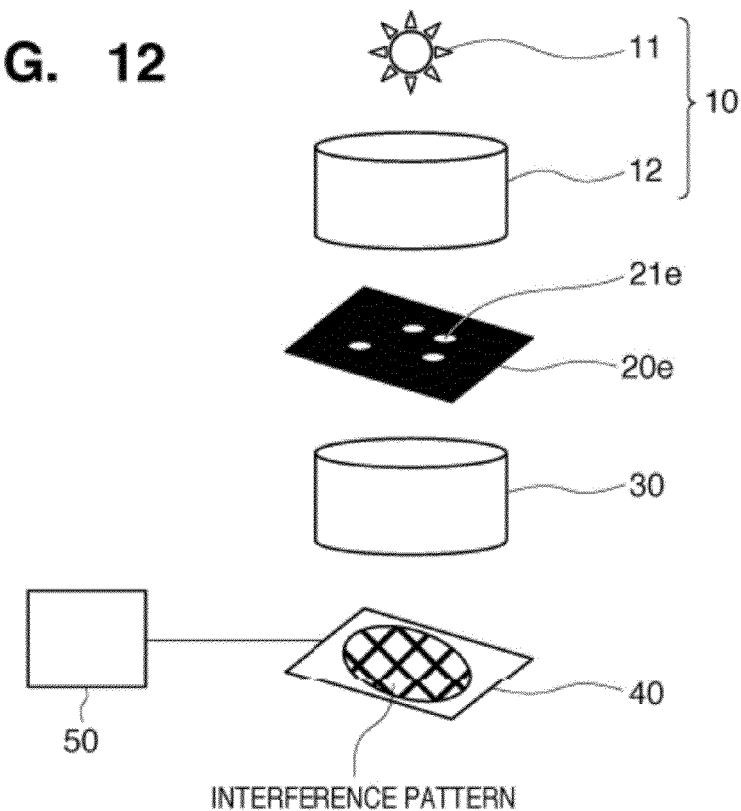
FIG. 12 is a view showing the schematic arrangement of a measurement apparatus and exposure apparatus according to the sixth embodiment of the present invention.

FIG. 12 is a view showing the schematic arrangement of a measurement apparatus and exposure apparatus according to the sixth embodiment of the present invention. This measurement apparatus is included in an exposure apparatus so as to measure σ in an exposure apparatus. This measurement apparatus uses a measurement mask 20e. Note that details which are not particularly referred to herein can be the same as in the first to fifth embodiments.

σ is the ratio (NAill/NApl) between a numerical aperture NAill of an illumination optical system 12 and a numerical aperture NApl of a projection optical system 30 when a circular region is illuminated by the illumination optical system 12. When the measurement mask 20e is Kohler-illuminated with a circular effective light source distribution having the numerical aperture NAill, spatial coherence is given by:

$$\Gamma(r) = \left[\frac{2J_1(R)}{R}\right] \quad (28)$$

$$R = \frac{2\pi r NAill}{\lambda}$$

where r is the distance from a reference point, $J_1$ is a first-order Bessel function. Note that Γ is normalized for a value r=0.

Figure 13:
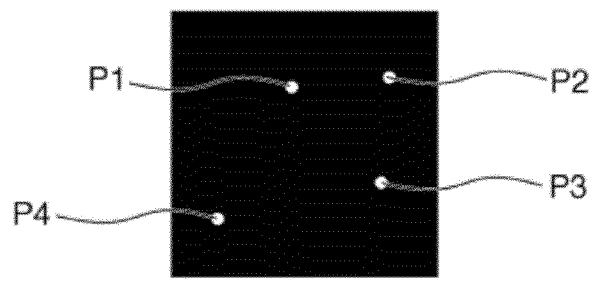
FIG. 13 is a view illustrating a pinhole pattern.

Assuming that spatial coherence has point symmetry, pinholes in the measurement mask 20e can be arranged at positions obtained by almost linearly changing the distances and angles between the pinholes, as illustrated in FIG. 13, in order to measure Γ in equation (28). In FIG. 13, when four pinholes are indicated by Q1, Q2, Q3, and Q4, the distances between Q1 and Q2, Q1 and Q3, Q1 and Q4, Q2 and Q3, Q2 and Q4, and Q3 and Q4 are R, 1.5R, 2R, 1.25R, 2.55R, and 1.7R, respectively.

Figure 14:
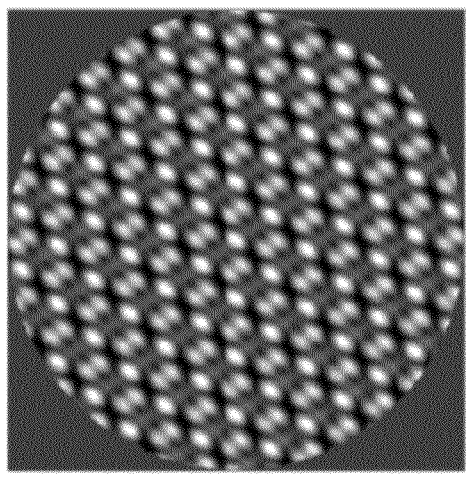
FIG. 14 is a view illustrating an interference pattern.
Figure 15:
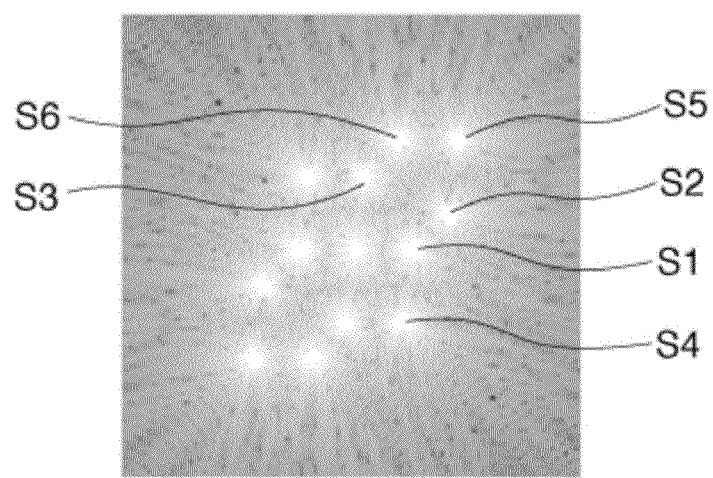
FIG. 15 is a view illustrating the Fourier spectrum of the interference pattern.

At this time, an interference pattern formed on the detection surface of a detector 40 by light transmitted through the pinholes is as shown in FIG. 14, and has a Fourier spectrum as shown in FIG. 15. In FIG. 15, the Fourier spectrum is indicated by the logarithm of an absolute value.

Fourier spectrum signals S1 to S6 represent that light beams transmitted through Q1 and Q2, Q1 and Q3, Q1 and Q4, Q2 and Q3, Q2 and Q4, and Q3 and Q4 interfere with each other on the detection surface of the detector 40 with certain spatial coherence. The values of the Fourier spectrum signals S1 to S6 depend on the magnitude of spatial coherence.

Figure 16:
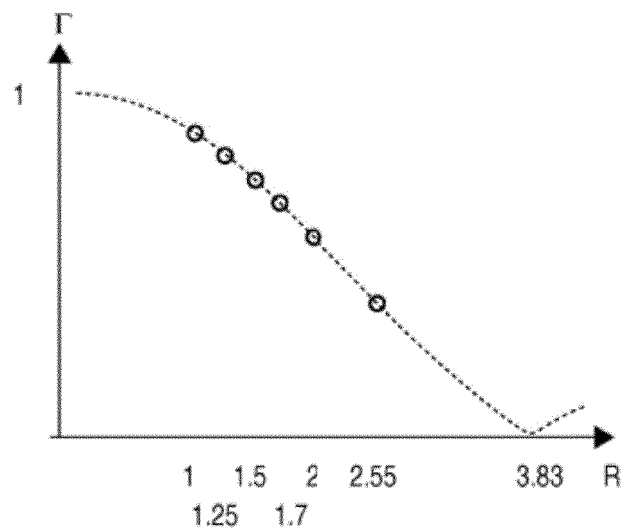
FIG. 16 is a graph illustrating spatial coherence.
Figure 17:
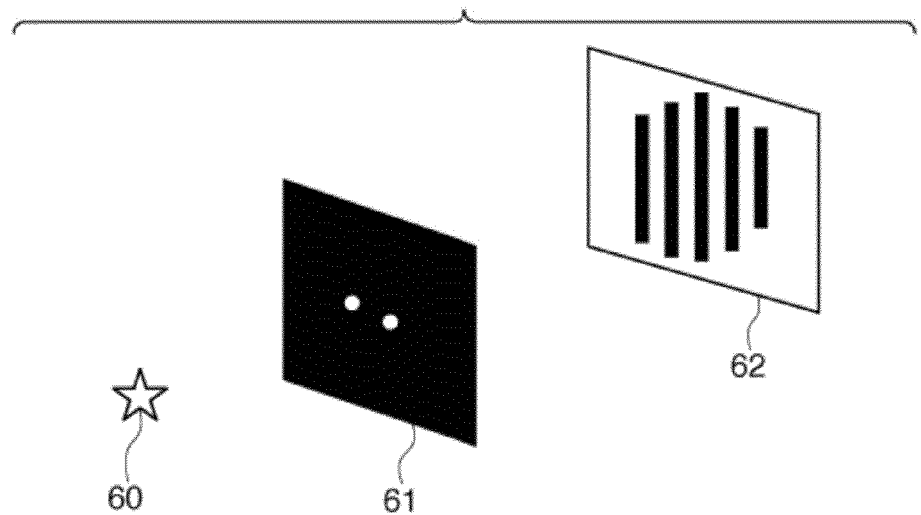
FIG. 17 is a view schematically showing a Yong interferometer.
Figure 18:
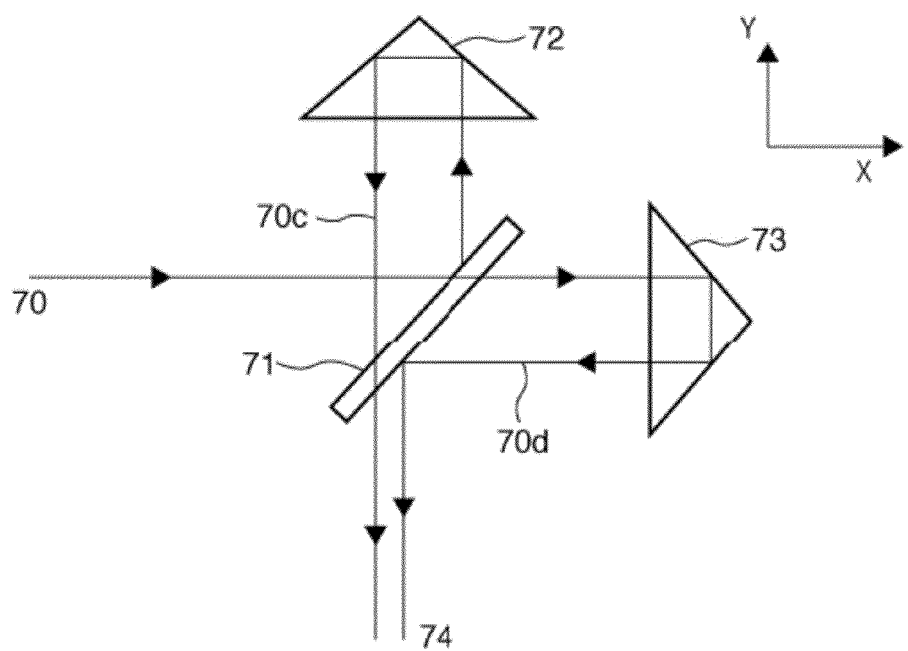
FIG. 18 is a view showing the principle of a shearing interferometer.

A calculator 50 can calculate spatial coherence in accordance with equation (9) using the signals S1 to S6 shown in FIG. 15, as in the third embodiment. This makes it possible to obtain spatial coherence Γ which depends only on the distance, as shown in FIG. 16. The calculator 50 can calculate σ from the value of Γ. Measurement points lie along the above-mentioned distances, that is, r=R, 1.5R, 2R, 1.25R, 2.55R, and 1.7R herein.

[Seventh Embodiment]

In the seventh embodiment of the present invention, a function of controlling the illumination system 10 is added to the calculators 50 in the first to sixth embodiments. The calculator 50 not only calculates spatial coherence obtained in the above-mentioned way, but also serves as a controller which controls the effective light source distribution in the illumination system 10 based on the spatial coherence.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-124971, filed May 12, 2008, which is hereby incorporated by reference herein in its entirety.

What is claimed is:

1. A measurement apparatus which measures spatial coherence in an illuminated plane illuminated by an illumination system, the apparatus comprising:

a measurement mask which has at least three pinholes and is arranged on the illuminated plane;

a detector configured to detect an interference pattern formed by lights from said at least three pinholes; and a calculator configured to calculate the spatial coherence in the illuminated plane based on a Fourier spectrum obtained by Fourier-transforming the interference pattern detected by said detector, wherein said calculator calculates spatial coherence $\Gamma_p$ in accordance with:

$$\Gamma_p = \frac{2NF_p}{N_p F_0}$$

where N is the total number of pinholes of said measurement mask, $N_p$ is the total number of pinholes which contribute to form an interference pattern with a frequency v of the detected interference pattern, $F_o$ is a value of the Fourier spectrum around zero frequency, and $F_p$ is a value of the Fourier spectrum around the frequency v.

* * * * *